(12) United States Patent
Buccos

(10) Patent No.: US 6,909,102 B1
(45) Date of Patent: Jun. 21, 2005

(54) ION IMPLANTER SYSTEM, METHOD AND PROGRAM PRODUCT INCLUDING PARTICLE DETECTION

(75) Inventor: Paul S. Buccos, Harverhill, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 10/761,768

(22) Filed: Jan. 21, 2004

(51) Int. Cl.[7] ............................................. H01J 37/244
(52) U.S. Cl. ................... 250/492.21; 250/397
(58) Field of Search ............................ 250/492.21, 397

(56) References Cited

U.S. PATENT DOCUMENTS

| | | |
|---|---|---|
| 4,739,177 A | 4/1988 | Borden |
| 4,798,465 A | 1/1989 | Knollenberg |
| 4,893,928 A | 1/1990 | Knollenberg |
| 5,047,648 A * | 9/1991 | Fishkin et al. ............ 250/492.2 |
| 5,146,098 A | 9/1992 | Stack |
| 5,266,798 A | 11/1993 | Borden et al. |
| 5,347,138 A | 9/1994 | Aqui et al. |
| 5,436,465 A | 7/1995 | Borden et al. |
| 5,534,706 A | 7/1996 | Borden et al. |
| 5,606,418 A | 2/1997 | Borden et al. |
| 5,751,422 A | 5/1998 | Mitchell |
| 5,883,378 A | 3/1999 | Irish et al. |
| 5,963,315 A | 10/1999 | Hiatt et al. |
| 6,061,132 A | 5/2000 | Girvin et al. |
| 6,069,690 A | 5/2000 | Xu et al. |
| 2002/0163637 A1 | 11/2002 | Rossman et al. |

FOREIGN PATENT DOCUMENTS

| | | |
|---|---|---|
| EP | 0231542 A2 | 12/1987 |
| EP | 0556471 A1 | 8/1993 |
| EP | 0791817 A1 | 8/1997 |
| EP | 1083424 A2 | 3/2001 |
| JP | 05040090 | 2/1993 |
| JP | 09113436 | 1/1997 |
| WO | WO 99/39183 | 8/1999 |
| WO | WO 02/40961 A2 | 5/2002 |

* cited by examiner

Primary Examiner—Kiet T. Nguyen

(57) ABSTRACT

An ion implanter system, method and program product for detecting at least one particle level in an beam and controlling the ion beam based on the at least one particle level during any stage of operation including ion implantation. A bright-field laser particle detector is employed that transmits and receives the laser beam directly through at least a portion of the ion beam to obtain an accurate particle level. The invention allows for observance of ion beam-borne particles and correction of the ion beam by a system controller in real-time to minimize particle level(s). During ion implantation, processing may be stopped until particle level (s) are below a preset value. The invention allows particle level detection during implantation such that post implant steps to check wafer particle levels are unnecessary.

17 Claims, 4 Drawing Sheets

ION IMPLANTER SYSTEM, METHOD AND PROGRAM PRODUCT INCLUDING PARTICLE DETECTION

BACKGROUND OF THE INVENTION

1. Technical Field

The present invention relates generally to ion implanters, and more particularly, to an ion implanter system, method and program product including particle detection.

2. Related Art

Particle detection is used extensively with vacuum processes used in such industries as semiconductor fabrication. In these industries, the smallest of particles can result in substantial numbers of defective products. One particular type of device that uses a vacuum during one stage of semiconductor fabrication is an ion implanter. Ion implanters are conventionally used to alter the characteristics of a silicon wafer by injecting a layer of ions into the wafer. This process is referred to as ion implantation or doping, and the implanted ions are referred to as the dopant Referring to FIG. 1, a conventional ion implanter 10, such as a Varian Semiconductor Equipment Associates ion implanter, is shown. Ion implanter 10 includes four general parts: a source 12, a focus line 14, an implant chamber 16 and an implant controller 17. Each part, excepting implant controller 17, is exposed to a vacuum. Source 12 receives a gas from a dopant source 18. Ions are formed into a rough beam 20 using a potential difference to pull positively charged ions into an ion analyzer 22. Ion analyzer 22 uses magnetic forces to select ions having a preferred size and potential. In particular, ion analyzer 22 conventionally forces all ions to be shifted a distance depending on their size and potential. Those that have the preferred size and potential are allowed to pass to a high voltage section 24, which controls their speed. Focus line 14 focuses the ion beam using, for example, quadrapole lenses 26, 28. Focused ion beam 30 is then moved vertically up-down and horizontally back-forth via a beam control hardware 32. Ions impact a silicon wafer(s) 34 positioned on a platen 36 in implant chamber 16. Platen 36 position may be controlled by a platen drive assembly 38 under control of a platen drive control 40. Each part of ion implanter 10 is controlled by implant controller 17.

Improved mechanical designs for ion implanters have dramatically reduced the number of particles formed by non-ion beam parameters such as friction between moving parts of platen drive assembly 38, built-up gas deposits on an interior implant chamber 16, broken wafers, etc. However, particles generated and transported by the wide aspect ratio ion beam remain a challenge. These particles may be generated, for example, by an arc occurring in ion implanter 10, ion beam 30 hitting an interior of implant chamber 16 during tuning, and a variety of other situations. Historically, few particle sensors have been implemented to detect particles in an ion beam and none have been implemented in such a way to allow control of ion implantation.

A number of approaches have been implemented to detect particles in semiconductor processing equipment in general. One approach to detect particle levels is to use a laser particle sensor. Laser particle sensors used relative to ion implanters have been limited to "dark-field" or scan laser sensors. In the dark-field approach, a laser is transmitted through an area where particles are expected to a black body dump that absorbs all of the energy. Simultaneously, photodetectors or photocells are placed off-axis (usually 90°) near the laser beam to sense reflected light from particles. The term "dark-field" is used since the laser beam is not projected on the photodetector, i.e., it is not received by the photodetector. This approach has a number of drawbacks. Foremost of these drawbacks is that a dark-field laser is incapable of looking through an ion beam, i.e., it is not transmitted through and then received by a photodetector, and is incapable of use in the presence of a bright ion beam or plasma. Dark-field lasers are also very sensitive to noise or background light, which results in particle count errors. In addition, dark-field lasers are incapable of being placed in close proximity to a wafer because debris coats the photodetector, which results in unacceptable signal degradation. To address this problem, the device is normally distanced from the wafer. This, however, results in inaccurate particle detection. Another shortcoming of conventional laser particle detectors is that they are used only during venting or vacuum pumping, and provide no information during actual ion implantation.

Another particle detection approach is disclosed in Borden et al., U.S. Pat. No. 5,606,418. In this approach, a "bright-field" laser is used to detect particles in vacuum process equipment used in processing semiconductor wafers. The term "bright-field" indicates that the laser is configured to transmit a laser beam through a very bright environment to a receiver. Particles are sensed by their breaking the path of the laser beam and the resulting amount of remittance received by the photodetector receiver. This approach, however, has never been applied to ion implanters.

One approach to particle detection that has been applied to ion implanters is disclosed in Stack, U.S. Pat. No. 5,146,098. In this approach, light generated during wafer processing is spectrally decomposed to detect characteristics of contaminating particles such as abnormal wavelength, frequency and/or energy intensity. This approach, however, does not address particles within the ion beam, but only particles within the implant chamber. In addition, Stack monitors ion implantation but does not address adjustment of the ion implantation.

In view of the foregoing, there is a need in the art for an ion implanter system having a way to detect a particle level in an ion beam and control ion implantation based on the detected particle level.

SUMMARY OF THE INVENTION

An ion implanter system, method and program product for detecting at least one particle level in an ion beam and controlling the ion beam based on the at least one particle level during any stage of operation including ion implantation. A bright-field laser particle detector is employed that transmits and receives the laser beam directly through at least a portion of the ion beam to obtain an accurate particle level. The invention allows for observance of ion beam-borne particles and correction of the ion beam by a system controller in real-time to minimize particle level(s). During ion implantation, processing may be stopped until particle level(s) are below a preset value. The invention allows particle level detection during implantation such that post implant steps to check wafer particle levels are unnecessary.

A first aspect of the invention is directed to an ion implanter system comprising: an ion beam generator for transmitting an ion beam to a target in an implant chamber; and a laser particle detector for detecting a particle level within the ion beam based on a received laser beam that has been transmitted through the ion beam, wherein the received laser beam passes in close proximity to the target.

A second aspect of the invention is directed to a method of detecting a particle level of an ion beam, the method comprising the steps of: transmitting a laser beam through at least a portion of the ion beam; directly receiving the laser beam; and determining at least one particle level in the at least a portion of the ion beam based on the directly received laser beam.

A third aspect of the invention is directed to a method of controlling an ion implanter system that generates an ion beam, the method comprising the steps of: transmitting a laser beam through at least a portion of the ion beam; receiving the laser beam; determining at least one particle level in the at least a portion of the ion beam based on the received laser beam; and controlling the ion implanter system during implantation based on the at least one particle level.

A fourth aspect of the invention is directed to a computer program product comprising a computer useable medium having computer readable program code embodied therein for controlling an ion implanter system that generates an ion beam used in ion implantation, the program product comprising: program code configured to receive at least one particle level from a particle detector during the ion implantation; and program code configured to control the ion implanter system based on the at least one particle level during the ion implantation.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION OF THE INVENTION

Ion Implanter System Overview

Figure 1:
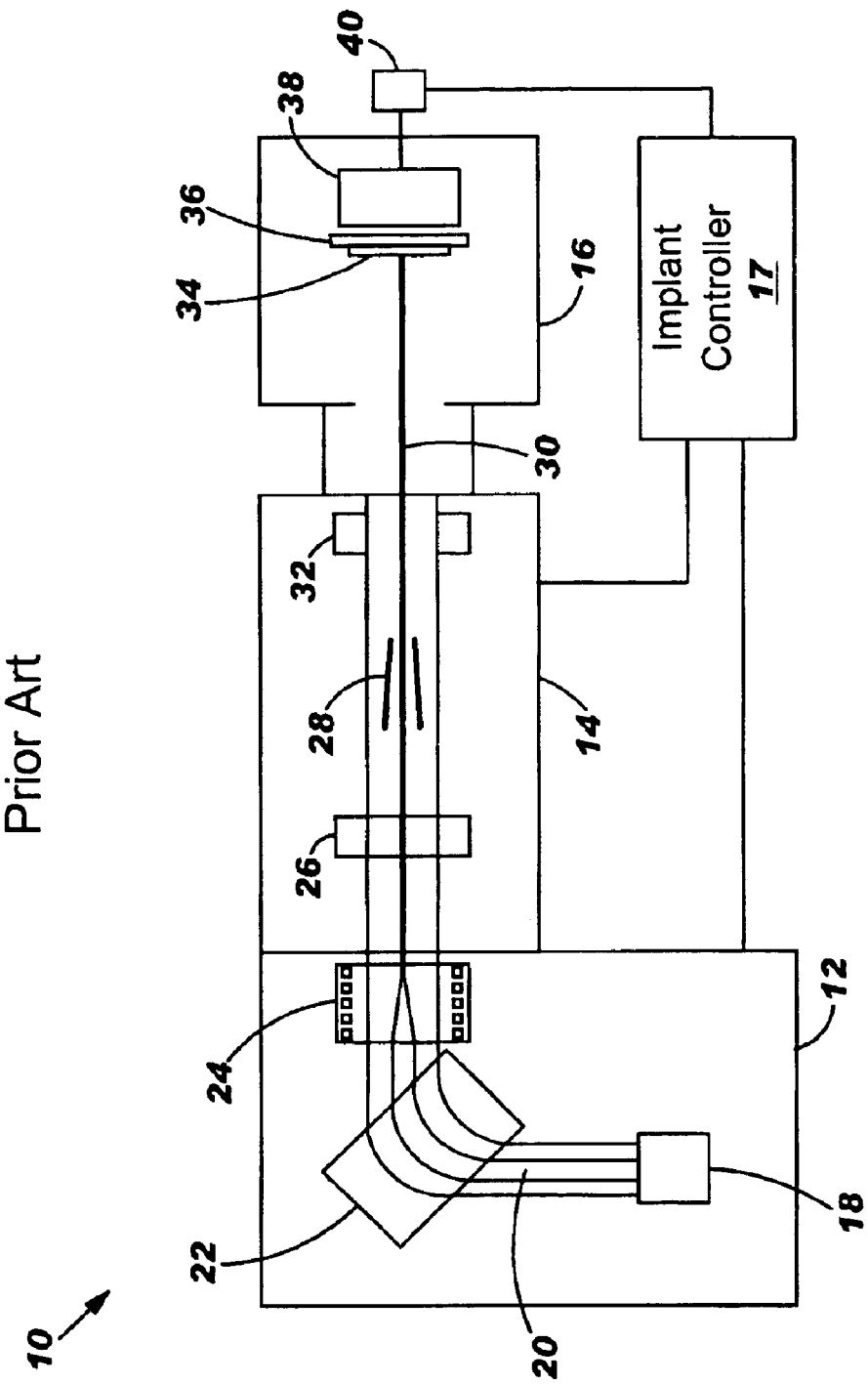
FIG. 1 shows a conventional ion implanter.
Figure 2:
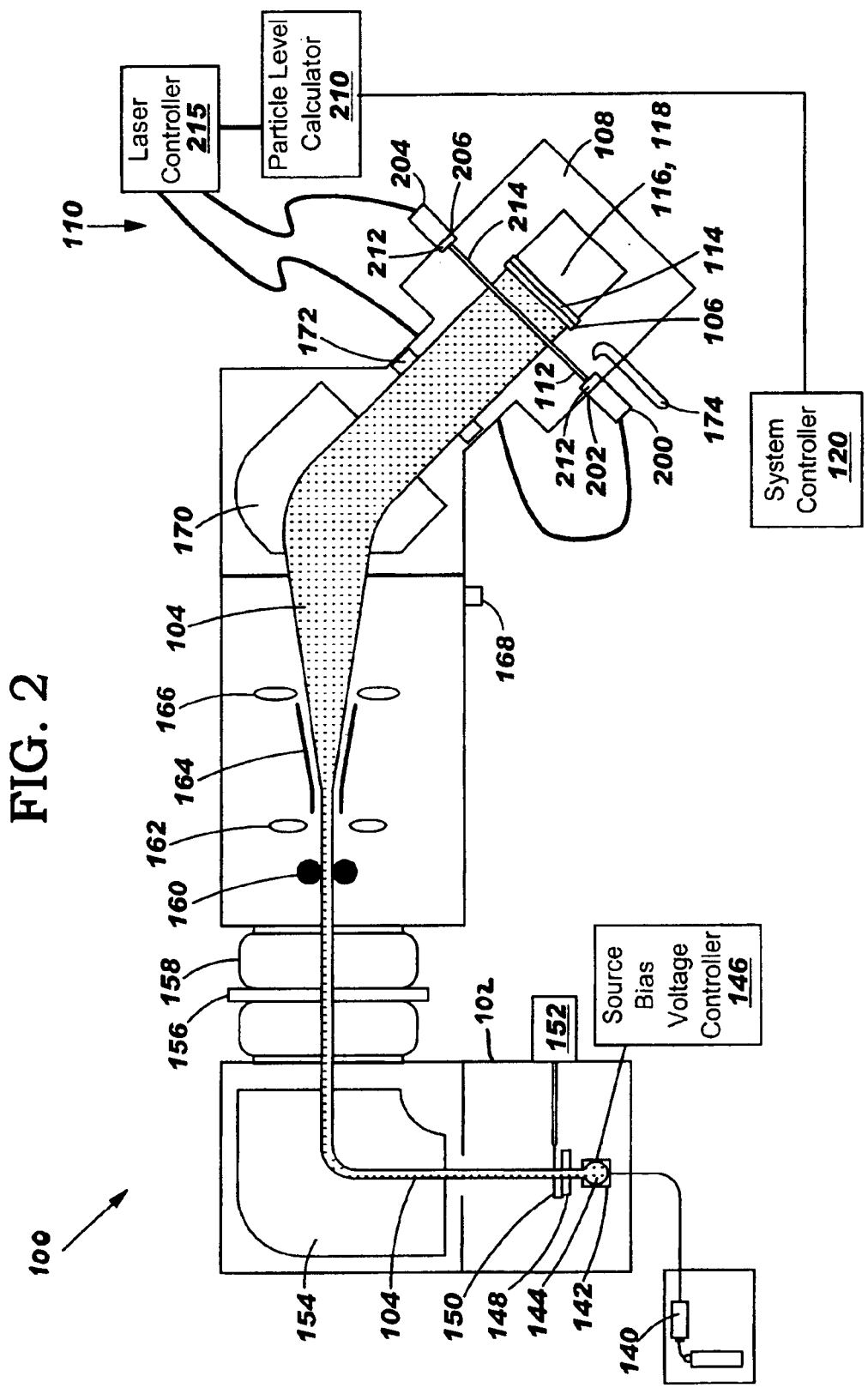
FIG. 2 shows an ion implanter system according to the present invention.

With reference to the accompanying drawings, FIG. 2 illustrates an ion implanter system 100 according to the present invention. Implanter system 100 includes an ion beam generator 102 for generating and transmitting an ion beam 104 to a target 106 in an implant chamber 108. System 100 also includes a laser particle detector 110 for detecting a particle level within ion beam 104 based on a received laser beam 112 that has been transmitted through ion beam 104. Ion beam generator 102 may be any now known or later developed ion beam generator such as those available from Varian Semiconductor Equipment Associates. Typically, target 106 includes one or more semiconductor wafers mounted to a platen 114. Characteristics of platen 114 and, hence, target 106, may be controlled by a platen drive assembly 116 that rotates the target 106, i.e., wafer, and a target vertical scan system position controller 118 that controls the vertical position of target 106. Drive assembly 116 and position controller 118 are both responsive to a system controller 120.

Besides the above-described components, ion beam generator 102 may include a gas flow 140; an ion source 142 including a source magnet 144 and a source bias voltage controller 146; a suppression electrode 148, an extraction electrode 150 and one or more manipulator motors 152 for electrodes 148, 150; an analyzer magnet 154; an accelerator focus electrode 156; an accelerator suppression electrode 158; a mass slit 160; a pre-scan suppression electrode 162; horizontal scan plates 164; a post-scan suppression electrode 166; a nitrogen ($N_2$) bleed 168; a corrector magnet 170; a limiting aperture 172; and a profiler system 174. Although not shown for clarity sake, each of the above-described components is monitored by and responsive to system controller 120.

Laser Particle Detector Overview

In one preferred embodiment, laser particle detector 110 includes a bright-field sensing laser such as an M9000 laser system available from Hach Ultra Analytics (formerly Pacific Scientific Instruments, formerly High Yield Technology) or similar models available from Particle Measuring Systems. It should be recognized that other bright-field sensing lasers may also be employed and not depart from the teachings of the invention. The term "bright-field" indicates that the laser is configured to transmit a laser beam through a very bright environment to a receiver. In operation, particles are sensed by their breaking the path of the laser beam and the resulting amount of remittance received by the receiver. This is in contrast to the dark-field laser that is absorbed in a dump, and has particles detected by reflection of the laser beam off of the particles. In one embodiment, the bright-field laser also transmits two separate beams, but this is not necessary.

Detector 110 includes a laser transmitter 200 positioned in a first window 202 in implant chamber 108, a receiver 204 positioned in an opposing second window 206 in implant chamber 108, a particle level calculator 210, and a laser controller 215. Each window 202, 204 may include a sapphire gradient 212. In one embodiment, laser beam 214 is transmitted directly through and substantially transverse to at least a portion of ion beam 104. Receiver 204 includes a photodetector or photocell that receives laser beam 214 transmitted by laser transmitter 200 after it has passed through at least a portion of ion beam 104. Laser controller 215 functions to control laser beam 214, e.g., transmit and receive laser signals, timing sequences, etc. Particle level calculator 210 functions to calculate at least one particle level, i.e., particle count, based on the remittance of laser beam 214 received at receiver 204. Detector 110, in one embodiment, can detect particles from 0.08 $\mu$m to 5.0 $\mu$m even though particles may be traveling at accelerated speeds, e.g., 40 m/s, due to a charged state. A particle level may be stated in terms of particle count/particle size range or a total particle count. Regarding the former, particle size ranges may be referred to as bins. Bins may be selected having particle size ranges of, for example: 0.35–0.4 $\mu$m, 0.4–0.45 $\mu$m, 0.45–0.5 $\mu$m and 0.5–0.55 $\mu$m. Detected particles are then assigned to a bin according to their size. For example, the following detected particle counts may be observed: 0.35–0.4 $\mu$m: 7, 0.4–0.45 $\mu$m: 4, 0.45–0.5 $\mu$m: 2, and 0.5–0.55 $\mu$m: 1. Use of bins allows analysis of particle levels within ranges. For example, in some cases only particles greater than 0.45 $\mu$m may be of concern. In this case, particle levels for the 0.35–0.4 $\mu$m and 0.4–0.45 $\mu$m bins may be ignored. As will be described in greater detail below, particle level calculator 210 communicates with system controller 120, which may alter operation of ion generator 102 in response to the particle level.

In order to attain an accurate particle level, laser beam 214 is preferably placed as close as possible to target 106 using conventional multi-position hardware (not shown). In one preferred embodiment, laser beam 214 is in "close proximity" to target 106, meaning no less than one eighth (⅛) inch from target 106 and no greater than necessary to allow tilting of target 106, e.g., up to 60°, relative to ion beam 104 for angled ion implantation. In one embodiment, the upper limit of "close proximity" is no greater than 4 inches from target 106. Detector 110 automatically changes sensitivity of receiver 204 to accommodate coating of laser transmitter 200 and receiver 204. Accordingly, coating of parts is not an issue.

System Controller Overview

Figure 3:
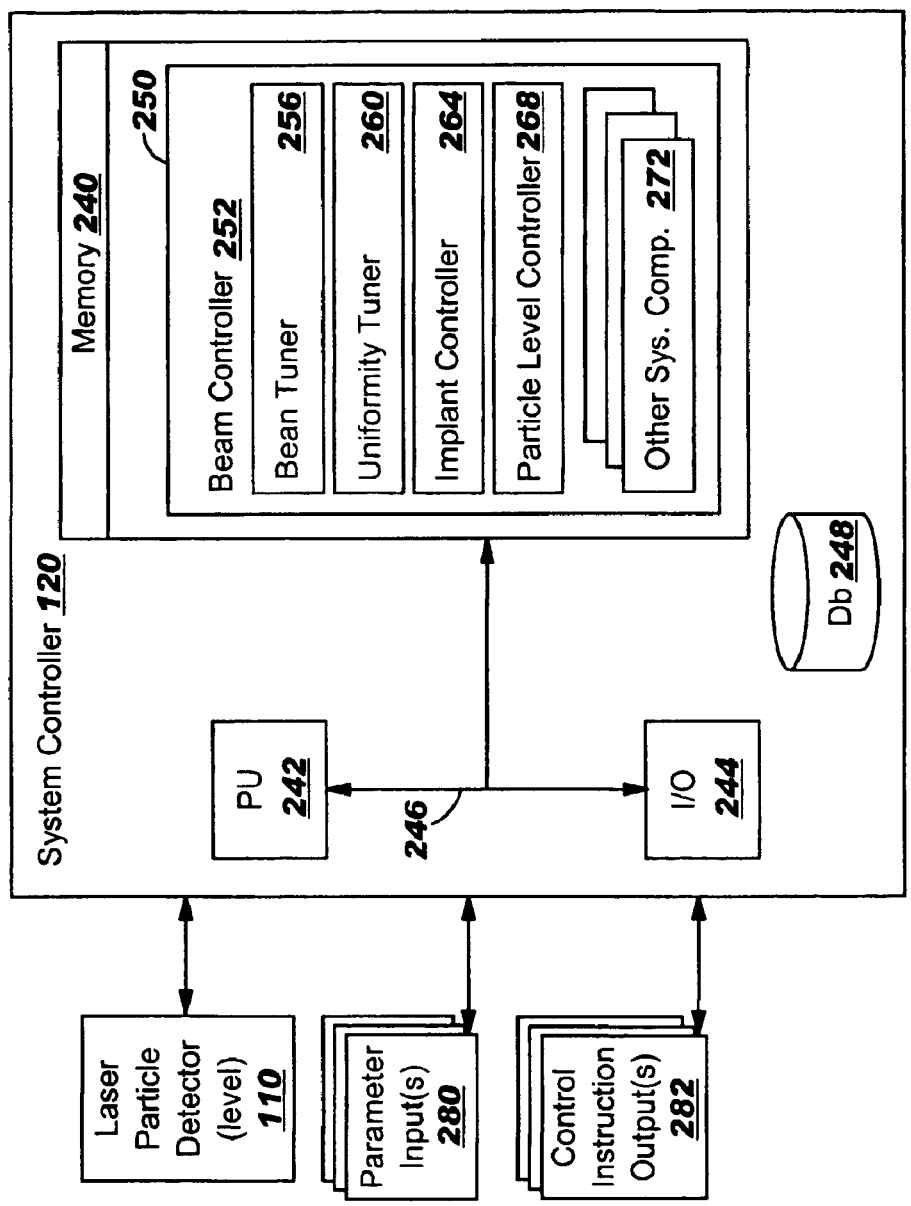
FIG. 3 shows a block diagram of a system controller of FIG. 2.

Referring to FIG. 3, a block diagram of system controller 120 is shown. System controller 120 includes a computer control system responsive to ion implanter system 100 inputs. In one embodiment, system controller 120 includes a memory 240, a processing unit (PU) 242, input/output devices (I/O) 244 and a bus 246. A database 248 may also be provided for storage of data relative to processing tasks. Memory 240 includes a program product 250 that, when executed by PU 240, comprises various functional capabilities described in further detail below. Memory 240 (and database 248) may comprise any known type of data storage system and/or transmission media, including magnetic media, optical media, random access memory (RAM), read only memory (ROM), a data object, etc. Moreover, memory 240 (and database 248) may reside at a single physical location comprising one or more types of data storage, or be distributed across a plurality of physical systems. PU 242 may likewise comprise a single processing unit, or a plurality of processing units distributed across one or more locations. I/O 244 may comprise any known type of input/output device including a network system, modem, keyboard, mouse, scanner, voice recognition system, CRT, printer, disc drives, etc. Additional components, such as cache memory, communication systems, system software, etc., may also be incorporated into system controller 120.

As shown in FIG. 3, program product 250 may include a beam controller 252 including a beam tuner 256, a uniformity tuner 260, an implant controller 264, a particle level controller 268 and other system components 272. Other system components 272 may include any now known or later developed parts of an ion implanter system controller not individually delineated herein.

Referring to FIGS. 2 and 3, inputs to system controller 120 include laser particle detector 110 and a wide variety of ion beam generator 102 parameter inputs 280 that indicate particular states of ion generator 102 and/or particular components thereof. That is, a parameter input 280 may be any characteristic of an ion beam generator 102 that may affect operation of the generator including, in particular to the present invention, particle levels in implant chamber 108. Based on the above-described components of ion beam generator 102, parameter inputs may include, for example, source magnet 142 voltage, source dopant gas 140 flow rate, source bias voltage 146, manipulator 152 positioning (e.g., X, Y, Z axis), suppression/extraction electrode 148, 150 current, acceleration suppression electrode 158 current, mass slit 160 spacing, pre and post-scan suppression electrode 162, 166 current, focus current, nitrogen ($N_2$) bleed 168 rate, corrector magnet 170 current, limiting aperture 172 control setting, profiler system 174 position, machine vacuum state, target vertical scan system position 118 control setting and/or horizontal ion beam scan speed. It should be recognized that the above-described list is meant to be illustrative only. For example, it is common for a conventional system controller to receive more than 5000 parameter inputs depending on the makeup of ion implanter being used.

Beam Controller

Beam controller 252 functions generally to control ion beam generator 102 components that affect ion beam generation (i.e., the above listed parameter inputs by controlling the above-described components) during different stages of operation. Beam tuner 256 conducts initial tuning of ion beam generator 102 for a particular specie, energy and mass resolving. Uniformity tuner 260 conducts an ion beam uniformity (i.e., uniformity and parallelism to target 106) procedure on ion beam generator 102. Implant controller 264 controls ion beam generator 102 during target ion implantation. Particle controller 268 may conduct intermediate analysis on a particle level as determined by particle level calculator 110, and interact with any of the other beam controller 252 components to control their respective functions based on the particle level. That is, particle controller 256 may interact with beam tuner 256, uniformity tuner 260 and/or implant controller 264 to control their respective functions based on the particle level. It should be recognized that while particle level calculator 210 is illustrated as being a separate component from particle controller 268, it may be provided as an integral part of particle controller 264. Adjustments of ion beam generator 102 can be made in real time based on the particle level, as detected by laser particle detector 110, during beam tuning, uniformity tuning and/or ion implantation. In one example, manipulator 152 may be adjusted to determine an optimum positioning for suppression/extraction electrodes 148, 150 that minimizes a particle level.

During ion implantation, implant controller 264 can determine optimal settings for ion beam generator 102 components, e.g., position and energy, to minimize the particle level in real-time. During this stage, implant controller 264 may adjust, for example, target vertical scan system position controller 118. In one embodiment, implant controller 264 may act to stop ion implantation if, for example, the particle level exceeds a preset value, e.g., less than 50 particles at 0.3–0.5 $\mu$m and less than 10 particles at 0.5 $\mu$m and larger.

In addition to control during an ion implantation stage, laser particle detector 110 may run continuously. When this is provided, adjustments during a tuning stage of ion beam generator 102 can be made by beam tuner 256 based on the particle level. During this stage, beam tuner 256 may adjust, for example, source magnet 142 voltage, source dopant gas 140 flow rate, source bias voltage controller 146, manipulator 152 positioning (e.g., X, Y, Z axis), suppression/extraction electrode 148, 150 current, acceleration suppression electrode 158 current, focus current, mass slit 160 spacing, pre and post-scan suppression electrode 162, 166 current, nitrogen ($N_2$) bleed 168 rate, corrector magnet 170 current, limiting aperture 172 control and/or profiler system 174 position. In one example, laser particle detector 110 may be used to detect particle distribution in ion beam 104, which can be caused by a number of factors. In one example, during tuning, ion beam 104 may hit an inside of implant chamber 108 and cause metal particles to scatter. In another example, during tuning, changing the energy level of ion beam 104 may cause metal debris by activation of different electrodes within ion beam generator 102. Each electrode 148, 150, 156, 158, 162, 166 (FIG. 2) as energized or de-energized can give off particles that become trapped in ion beam 104. In any case, tuning would be adjusted by beam tuner 256 to reduce or eliminate the debris, or stopped until the particle level decreases.

Continuous running of laser particle detector 110 may also be advantageous for control of beam uniformity procedures conducted by uniformity tuner 260. During this stage, uniformity tuner 264 may adjust, for example, pre and post-scan suppression electrode 162, 166 current, corrector magnet 170 current, profiler system 174 position and/or horizontal ion beam scan speed to minimize the particle level.

Particle level detection may also be implemented during a cleaning stage of any part of ion implanter system 100 to assure proper cleaning. In particular, during cleaning, implant chamber 108 and the rest of ion implanter system 100 are vented, which stirs up debris. After venting, laser particle detector 110 can be used to detect a particle level in implant chamber 108 before operating ion implanter system 100.

It should be recognized that while a particular compartmentalization of functional components of ion implanter system 100 has been shown, it is envisioned that the arrangement may be altered within the scope of the invention. For example, while particle level calculator 210 has been illustrated as a separate component, it may be included as part of system controller 120, i.e., as part of particle controller 268.

Operation Methodology

Figure 4:
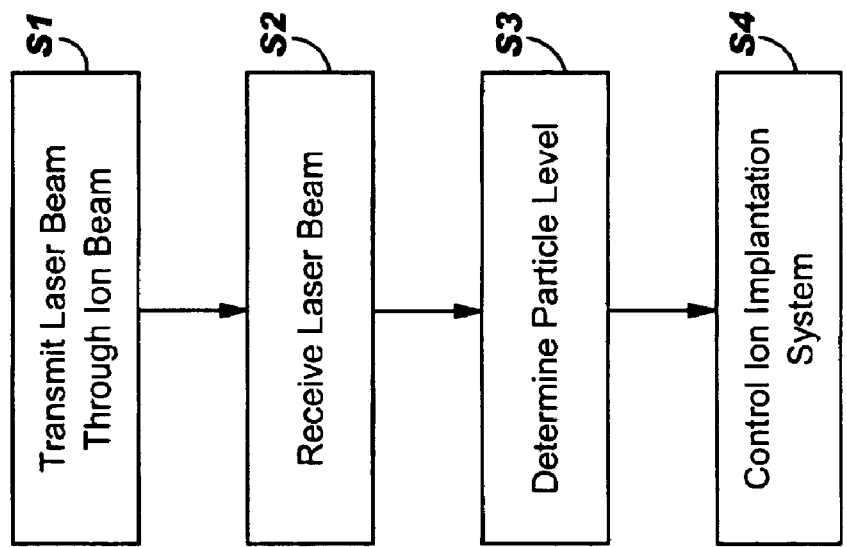
FIG. 4 shows a flow diagram of operation of the ion implanter system

Referring to FIG. 4, a flow diagram of operation methodology for detecting a particle level and controlling an ion implanter system 100 (FIG. 2) will now be described. Referring to FIG. 4 in conjunction with FIG. 2, in a first step S1, laser beam 214 is transmitted through ion beam 104 by transmitter 200. As noted above, the transmitting step may include transmitting the laser beam substantially transversely across ion beam 104. In addition, ion beam 104 is incident on target 106, and laser beam 214 passes no less than one eighth of an inch from target 106 and no greater than four inches from target 106.

In step S2, laser beam 214 is directly received by receiver 204. That is, laser beam 214 is substantially incident on receiver 204. In step S3, a particle level in ion beam 104 based on the directly received laser beam 214 is determined. The frequency of this determination can be user selected, e.g., beginning and end of a particular procedure and perhaps 1/sec during a particular procedure. And, in step S4, ion implanter system 100 is controlled during ion implantation based on the particle level. As also noted above, the controlling step may also occur during at least one a tuning stage of ion implanter system 100, a uniformity procedure and a cleaning stage of ion implanter system 100. During ion implantation, in the case that the particle level exceeds a preset value, the controlling step may include stopping ion implantation.

Conclusion

In the previous discussion, it will be understood that the method steps discussed are performed by a processor, such as PU 242 of system controller 120, executing instructions of program product 250 stored in memory. It is understood that the various devices, modules, mechanisms and systems described herein may be realized in hardware, software, or a combination of hardware and software, and may be compartmentalized other than as shown. They may be implemented by any type of computer system or other apparatus adapted for carrying out the methods described herein. A typical combination of hardware and software could be a general-purpose computer system with a computer program that, when loaded and executed, controls the computer system such that it carries out the methods described herein. Alternatively, a specific use computer, containing specialized hardware for carrying out one or more of the functional tasks of the invention could be utilized. The present invention can also be embedded in a computer program product, which comprises all the features enabling the implementation of the methods and functions described herein, and which—when loaded in a computer system—is able to carry out these methods and functions. Computer program, software program, program, program product, or software, in the present context mean any expression, in any language, code or notation, of a set of instructions intended to cause a system having an information processing capability to perform a particular function either directly or after the following: (a) conversion to another language, code or notation; and/or (b) reproduction in a different material form.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. An ion implanter system comprising:
    an ion beam generator for transmitting an ion beam to a target in an implant chamber; and
    a laser particle detector for detecting at least one particle level within the ion beam based on a received laser beam that has been transmitted through the ion beam, wherein the received laser beam passes in close proximity to the target.

2. The system of claim 1, wherein the laser particle detector is coupled to a system controller including a beam controller configured to control the ion beam generator based on the at least one particle level during an ion implantation.

3. The system of claim 2, wherein the beam controller stops ion implantation in the case that the at least one particle level exceeds a preset value.

4. The system of claim 2, wherein the beam controller is further configured to control the ion beam generator during a tuning of the ion beam based on the at least one particle level.

5. The system of claim 2, wherein the beam controller is further configured to control the ion beam generator during a uniformity procedure of the ion beam based on the at least one particle level.

6. The system of claim 2, wherein the system controller is also configured to control the ion beam based on the at least one particle level during at least one of a tuning stage of operation and a cleaning stage of operation.

7. The system of claim 2, wherein the laser particle detector includes a bright-field sensing laser and a particle level calculator.

8. The system of claim 7, wherein the bright-field sensing laser includes a transmitter positioned in a first window in the implant chamber and a receiver positioned in an opposing second window in the implant chamber to receive the received laser beam.

9. The system of claim 7, wherein the laser beam passes no less than one eighth of an inch from the target and no greater than four inches from the target.

10. The system of claim 1, wherein the laser particle detector includes a bright-field sensing laser.

11. The system of claim 10, wherein the bright-field sensing laser transmits a laser beam substantially transversely across the ion beam.

12. The system of claim 11, wherein the laser beam passes no less than one eighth of an inch from the target and no greater than four inches from the target.

13. The system of claim 10, wherein the bright-field sensing laser includes a transmitter positioned in a first window in the implant chamber and a receiver positioned in an opposing second window in the implant chamber to receive the received laser beam.

14. A method of controlling an ion implanter system that generates an ion beam, the method comprising the steps of:

transmitting a laser beam through at least a portion of the ion beam;

receiving the laser beam;

determining at least one particle level in the at least a portion of the ion beam based on the received laser beam; and controlling the ion implanter system during implantation based on the at least one particle level.

15. The method of claim 14, wherein the transmitting step includes transmitting the laser beam substantially transversely across the at least a portion of the ion beam.

16. The method of claim 14, wherein the controlling step further includes controlling the ion implanter system during at least one of a tuning stage of the ion implanter system, a uniformity procedure of the ion implanter system and a cleaning stage of the ion implanter system.

17. The method of claim 14, wherein the controlling step includes stopping ion implantation in the case that the at least one particle level exceeds a preset value.

* * * * *